US010553702B2

(12) United States Patent
Batude et al.

(10) Patent No.: US 10,553,702 B2
(45) Date of Patent: Feb. 4, 2020

(54) TRANSISTOR WITH CONTROLLED OVERLAP OF ACCESS REGIONS

(71) Applicant: COMMISSARIAT A L'ENERGIE ATOMIQUE ET AUX ENERGIES ALTERNATIVES, Paris (FR)

(72) Inventors: Perrine Batude, Dijon (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/485,246

(22) Filed: Apr. 12, 2017

(65) Prior Publication Data
US 2017/0301692 A1  Oct. 19, 2017

(30) Foreign Application Priority Data
Apr. 19, 2016  (FR) ...................... 16 53442

(51) Int. Cl.
*H01L 21/02* (2006.01)
*H01L 21/306* (2006.01)
(Continued)

(52) U.S. Cl.
CPC .... *H01L 29/66636* (2013.01); *H01L 21/0217* (2013.01); *H01L 21/30604* (2013.01);
(Continued)

(58) Field of Classification Search
CPC ............. H01L 29/7848; H01L 29/6656; H01L 29/66575; H01L 29/6659; H01L 29/66636;
(Continued)

(56) References Cited

U.S. PATENT DOCUMENTS 8,951,868 B1 *  2/2015  Jain ..................... H01L 29/6681
                                                       438/183
2005/0112817 A1 *  5/2005  Cheng ............. H01L 21/823807
                                                       438/219
(Continued)

OTHER PUBLICATIONS

K. Cheng, et al., "Extremely Thin SOI (ETSOI) CMOS with Record Low Variability for Low Power System-on-Chip Applications", IEEE International Electron Devices Meeting (IEDM), 2009, 4 pages.
(Continued)

*Primary Examiner* — Allen L Parker
*Assistant Examiner* — Pauline Vu
(74) *Attorney, Agent, or Firm* — Oblon, McClelland, Maier & Neustadt, L.L.P.

(57) ABSTRACT

A method for producing a microelectronic device with one or more transistor(s) including forming a first gate on a region of a semiconductor layer, forming a first cavity in the semiconductor layer, the first cavity having a wall contiguous with the given region, filling the first cavity in such a way as to form a first semiconductor block wherein a source or drain region of the first transistor is capable of being produced, by epitaxial growth of a first semiconductor material in the first cavity, the growth being carried out such that a first zone of predetermined thickness of the layer of first semiconductor material lines the wall contiguous with the given region, epitaxial growth of a second zone made of a second semiconductor material on the first zone.

7 Claims, 9 Drawing Sheets

(51) Int. Cl.
*H01L 27/12* (2006.01)
*H01L 29/66* (2006.01)
*H01L 21/8238* (2006.01)

(52) U.S. Cl.
CPC .... *H01L 21/8238* (2013.01); *H01L 29/66545* (2013.01); *H01L 29/66553* (2013.01)

(58) Field of Classification Search
CPC ..... H01L 21/823814; H01L 21/823807; H01L 29/66545; H01L 21/8238; H01L 29/66553
See application file for complete search history.

(56) References Cited

U.S. PATENT DOCUMENTS

| | | | | |
|---|---|---|---|---|
| 2008/0199999 | A1* | 8/2008 | Weijtmans | H01L 29/165 438/285 |
| 2008/0258216 | A1* | 10/2008 | Kikuchi | H01L 29/4983 257/344 |
| 2008/0265256 | A1* | 10/2008 | Lin | H01L 29/665 257/70 |
| 2008/0290370 | A1* | 11/2008 | Han | H01L 21/823807 257/192 |
| 2009/0085123 | A1* | 4/2009 | Sato | H01L 21/823807 257/369 |
| 2010/0072523 | A1* | 3/2010 | Sato | H01L 21/28088 257/289 |
| 2010/0224937 | A1* | 9/2010 | Sridhar | H01L 21/823807 257/369 |
| 2010/0301350 | A1* | 12/2010 | Tamura | H01L 21/823807 257/77 |
| 2011/0195550 | A1* | 8/2011 | Chang | H01L 21/28079 438/230 |
| 2012/0003806 | A1* | 1/2012 | Wang | H01L 29/66545 438/305 |
| 2012/0049247 | A1* | 3/2012 | Lee | H01L 21/28114 257/288 |
| 2012/0094459 | A1* | 4/2012 | Park | H01L 21/02068 438/299 |
| 2012/0223364 | A1* | 9/2012 | Chung | H01L 21/823807 257/192 |
| 2013/0285146 | A1* | 10/2013 | Tung | H01L 21/823807 257/368 |
| 2014/0138745 | A1* | 5/2014 | Shin | H01L 29/4966 257/192 |
| 2015/0021696 | A1 | 1/2015 | Sung et al. | |
| 2015/0048417 | A1 | 2/2015 | Kwok et al. | |
| 2016/0056290 | A1 | 2/2016 | Tsai et al. | |

OTHER PUBLICATIONS

French Preliminary Search Report dated Jan. 6, 2017 in French Application 16 53442, filed on Apr. 19, 2016 (with English Translation of Categories of cited documents).

* cited by examiner

TRANSISTOR WITH CONTROLLED OVERLAP OF ACCESS REGIONS

TECHNICAL FIELD AND PRIOR ART

The present invention relates to the field of transistors and concerns a device with one or more transistors as well as a method for producing such a device.

The operation of a MOS field effect transistor is based on a modulation of the concentration of charges in a semiconductor channel region through a gate electrode situated on this region.

On either side of the channel region, semiconductor blocks form source and drain regions that can be produced in a material having a lattice parameter and/or a doping different to that of the channel region in order to improve the performances of the transistor.

To manufacture such blocks, one method consists in forming cavities on either side of the channel region then carrying out an epitaxial growth of semiconductor material. During this growth, a doping (qualified as "in situ") may be carried out.

FIGS. 1A-1C show different layouts of a semiconductor block 4 produced in the manner described above, by epitaxy in a cavity adjoining a semiconductor region 2 in which a channel of a transistor is provided. This semiconductor region 2 is generally non-doped or lightly doped, that is to say less than 10e19 at/$cm^3$.

Insulating spacers 5 laid out against the lateral flanks of the gate 6 of the transistor are moreover provided to make it possible to isolate it from the source and drain regions.

FIG. 1A illustrates a layout qualified as "underlap" in which a semiconductor block 4, which may be doped, only extends partially under the spacers 5.

The semiconductor block 4, in which a source or drain region is capable of being formed, is situated at a distance Δu from a zone of the semiconductor region 2 which is arranged facing an interface between the gate 6 and a spacer 5.

In order to limit resistance between the channel region 2 and the source and drain regions and/or to further stress the channel region 2 of the transistor, it may be sought to bring the semiconductor block 4 closer to the channel region.

This may lead to a layout such as illustrated in FIG. 1B and which may be qualified as "overlap" with a semiconductor block 4 which extends under the spacers 5 and facing the gate 6.

Most of the time it is sought to avoid a too significant encroachment and to reduce the encroachment distance Δo in which the semiconductor block 4 extends facing the gate.

FIG. 1C illustrates a layout without "overlap" or "underlap" that it is generally sought to obtain. The semiconductor block 4 extends under a spacer 5 this time up to a zone aligned with the interface between the gate and said spacer 5.

The problem is posed of producing a device with one or more transistors with improved performances and in which the positioning, with respect to the gate and to the spacers, of a semiconductor block able to receive a source or drain region is better controlled.

DESCRIPTION OF THE INVENTION

According to one aspect, the present invention relates to a method for producing a microelectronic device with one or more transistor(s) comprising the steps of:

a) formation of at least one first gate on a given region of a semiconductor layer in which a channel of a first transistor is capable of being produced, b) formation of at least one first cavity in the semiconductor layer, the first cavity having a wall contiguous with the given region, said wall being essentially perpendicular to a main face of the semiconductor layer, c) filling of the first cavity in such a way as to form a first semiconductor block in which a source or drain region of the first transistor is capable of being produced, the formation of the first semiconductor block comprising the steps of:

epitaxial growth of a first semiconductor material in the first cavity, the growth being carried out such that a first zone of predetermined thickness $e_1$ of the layer of first semiconductor material lines the wall contiguous with the given region, epitaxial growth of a second zone made of a second semiconductor material on the first zone.

The second material may have a doping different to that of the first semiconductor material or have a lattice parameter different to that of the first semiconductor material or have both a doping different to that of the first semiconductor material as well as a lattice parameter different to that of the first semiconductor material.

At step c) the positioning of an interface between the first semiconductor material and the second semiconductor material is defined precisely, which makes it possible thereafter to be able to control precisely the position of the channel access regions.

Advantageously, the first semiconductor material is non-doped or has a lower doping than that of the second semiconductor material.

It is thus possible to define precisely the positioning of an interface between doped zone and non-doped or lightly doped zone, in other words junctions in the first transistor.

According to one possible embodiment, the first zone of first semiconductor material and the given region in which a transistor channel is capable of being formed are based on a same semiconductor material.

According to a particular embodiment, the second semiconductor zone is formed by epitaxial growth of the second semiconductor material such that the second semiconductor material consists of a gradient in concentration of dopants or a gradient in concentration of germanium or a gradient in concentration of dopants while having a gradient in concentration of germanium. It is thus possible to ensure that the doping is progressively increased as one moves away from the channel and/or to increase the stress as one approaches the channel. Such an embodiment may be implemented in particular to produce a PMOS type transistor.

In the case where a NMOS transistor is produced, carbon is added to the second semiconductor zone in order to have a tensile stress.

According to a possible embodiment of the method, it may further comprise, after step c) of formation of the first semiconductor block, the steps of:

deposition of a protective layer on the first transistor, etching of this protective layer so as to form protective blocks on either side of the first gate.

The protective blocks are laid out as a function of the positioning of an interface between the first zone of first semiconductor material and the second zone of second semiconductor material.

Thus, the thickness of the protective layer and the etching of this protective layer are provided such that an outer face of the protective blocks is positioned at a controlled distance with respect to said interface.

This distance may be zero. Preferably, the protective blocks are thus produced such that their outer face is aligned with said interface between first and second semiconductor material.

The protective blocks may form spacers or even sacrificial spacers.

By controlling the positioning of the sacrificial spacers with respect to the interface between first and second semiconductor material, it is possible to control the positioning of the insulating spacers with respect to this interface.

When the outer face of the protective blocks is aligned with said interface between first and second semiconductor material, it is possible to form insulating spacers of which the inner face is aligned with said interface between first and second semiconductor material. It is thus possible to produce a transistor without overlap.

According to a possible embodiment of the method, the first gate formed at step a) may be a sacrificial gate.

In this case, after production of the protective blocks, the method may comprise the steps of:
  formation of insulating spacers on either side of the protective blocks,
  removal of the first gate,
  removal of the protective blocks,
  formation of a replacement gate between the insulating spacers.

The removal of the protective blocks may advantageously be carried out by selective etching vis-à-vis the insulating spacers.

An alternative embodiment of the method provides for producing a controlled overlap.

In this case, after production of the protective blocks and prior to the formation of insulating spacers, the method may further comprise the steps of:
  formation of additional protective blocks against the protective blocks, the insulating spacers next being formed against the additional protective blocks,
  removal of the first gate,
  removal of the protective blocks and the additional protective blocks,
  formation of a replacement gate between the insulating spacers.

The overlap or encroachment obtained depends on the thickness of the additional protective blocks.

According to a possible embodiment of the method, when it is wished to remove the first gate with a view to replacing it, the following steps may be provided:
  formation of a masking covering the first transistor, then
  planarization of the masking so as to remove a portion of the masking and expose the first gate, then
  etching of the first gate so as to form an opening.

This opening could serve as emplacement for a replacement gate. The first gate thus plays the role of a sacrificial gate.

The masking covering the first transistor may also be formed on a second transistor of a second type, the planarization of the masking then being carried out in such a way as to remove a portion of the masking and expose the gate of the second transistor at the same time as the first gate of the first transistor. During the step of etching of the first gate so as to form an opening, at the same time another opening is formed by removing the sacrificial gate of the second transistor.

Next the opening and the other opening may be filled at the same time using a same material or a same stack of materials or instead successively by different gate stacks.

The formation of the replacement gate may then comprise the steps of:
  removal of the protective blocks so as to enlarge the opening, then
  formation of a gate stack in the opening.

A step of planarization of the gate stack is next advantageously carried out.

According to a possible embodiment of the method, an insulating layer of said masking may serve to form the insulating spacers of the first transistor.

Thus, according to a possible embodiment of the method, the masking on the first transistor consists of an insulating layer deposited directly on the protective blocks.

Next, during the planarization of the masking so as to expose the first gate, blocks of this insulating layer are conserved on either side of the first gate so as to form said insulating spacers against the protective blocks.

According to a particular embodiment of the method, it is possible to form at least one raised source and/or drain region for the first transistor.

In this case, the method may further comprise, after step c), the steps of:
  formation of insulating zones on either side of the first gate,
  growth of semiconductor material on the first semiconductor block so as to form a raised source or drain semiconductor region.

According to a particular embodiment of the method, a first transistor may be formed of which the source and drain regions are asymmetric and have different compositions in terms of material and/or doping.

This is the case in particular when the transistor produced is a TFET type transistor with source and drain regions doped according to different types of doping, the source region being doped according to a doping of a first N or P type, the drain region being doped according to a doping of an opposite P or N type.

According to a possible embodiment of the method, at step b) the first cavity is produced by etching of a first portion of the semiconductor layer adjoining said given region in which the channel of the first transistor is capable of being formed, whereas a second portion of the semiconductor layer also adjoining said given channel region of the transistor is protected and is not etched, the first portion and the second portion being arranged on either side of the given region, the method further comprising, after step c), the steps of:
  formation of a second cavity by etching of the second portion, the second cavity having a wall contiguous with the given region then,
  filling of the second cavity by a semiconductor material so as to form a second semiconductor block in which a drain or source region is capable of being formed.

The second semiconductor block may be made of a material different to that of the first semiconductor block.

The second semiconductor block may have a doping different to that of the first semiconductor block and in particular of a type opposite to that of the first block, for example of N type when the first semiconductor block is P doped or of P type when the first semiconductor block is N doped.

During step b), the second portion may be protected by a first protective layer whereas a protective block produced in the first protective layer is laid out against a lateral flank of the first gate situated on the side of the first portion. The method may then further comprise, after step c) and prior to the formation of the second cavity, the steps of:

deposition of a second protective layer, etching of the second protective layer so as to produce another protective block formed of a stack of the first protective layer and the second protective layer against a lateral flank of the first gate situated on the side of the second portion, said contiguous wall being situated in the extension of the other protective block.

Such an alternative of method may make it possible to obtain a dissymmetrical distribution with respect to the channel of the semiconductor blocks in which the source and drain regions are capable of being formed.

An embodiment of the present invention also provides for the implementation of at least one second transistor which may be of a type different to that of the first transistor, for example of N type when the first transistor is of P type, or instead of P type when the first transistor is of N type.

Thus, according to this particular embodiment wherein the first transistor is a transistor of a first type whereas a second gate of a second transistor of a second type is formed at step a) on the semiconductor layer, and wherein during the production of the first cavity the second transistor is protected by a first mask, the method may comprise, after step c), the steps of:

removal of the first mask, formation of a second mask on the first transistor, formation of other cavities in the semiconductor layer, around another region of the semiconductor layer on which rests the second gate and in which a channel of the second transistor is capable of being produced, formation of semiconductor blocks in the other cavities and in which source and drain regions of the second transistor are capable of being produced.

According to another aspect, the present invention relates to a microelectronic device with one or more transistor(s) comprising:

at least one first transistor provided with a gate on a given region of a semiconductor layer in which a channel of a first transistor is capable of being formed, a first semiconductor block in which a source or drain region of the first transistor is capable of being produced extending in a first cavity formed in the semiconductor layer, said wall being essentially perpendicular to a main face of the semiconductor layer, the first semiconductor block comprising a first zone of first semiconductor material, the first zone lining a wall contiguous with the given region in which a channel of a first transistor is capable of being formed, the first zone being covered by a second zone made of a second semiconductor material, said second material being a semiconductor having a doping different to that of the first semiconductor material and/or having a lattice parameter different to that of the first semiconductor material, the transistor being further provided with insulating spacers laid out on either side of the gate, at least one first insulating spacer being arranged with respect to the first semiconductor block such that an inner face of this first insulating spacer is aligned with an interface between the first semiconductor material and the second semiconductor material.

According to a possible embodiment, the device may comprise at least one second transistor provided with a second gate on a region of the semiconductor layer in which a channel of the second transistor is capable of being formed, source or drain semiconductor blocks of the second transistor extending in second cavities formed in the semiconductor layer, the source and drain semiconductor blocks of the second transistor having a composition different to that of the first semiconductor block. Different "composition" is taken to mean a different material in terms of structure and/or doping.

According to a possible embodiment, the first transistor may consist of at least one second drain or source semiconductor block, extending in a second cavity formed in the semiconductor layer, said second cavity being filled with a semiconductor material doped or having a lattice parameter different to that of the given region of the semiconductor layer in which the channel of the first transistor is capable of being formed.

The first semiconductor block and the second semiconductor block may be dissymmetrical with respect to the channel region of the first transistor.

BRIEF DESCRIPTION OF THE DRAWINGS

The present invention will be better understood on reading the description of exemplary embodiments given purely for illustrative purposes and non-limiting, and by referring to the appended drawings in which.

Figure 1A:
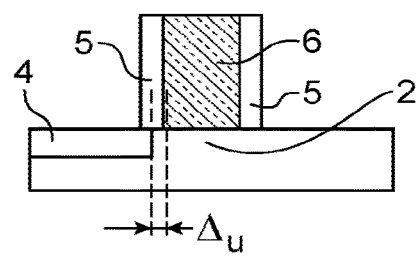
FIGS. 1A-1C serve to illustrate different layouts of a semiconductor block intended to receive a source and drain region in a transistor.
Figure 1B:
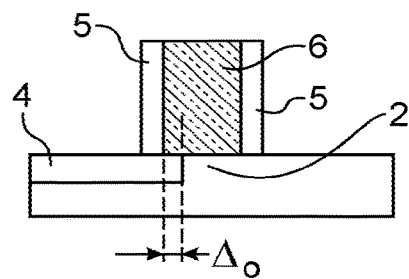
Figure 1C:
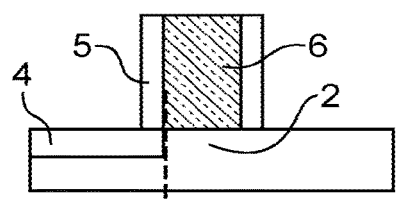

Moreover, in the following description, terms that depend on the orientation of the device, such as "upper", "lateral", "inner", "outer" apply by considering that the structure is oriented in the manner illustrated in the figures.

Identical, similar or equivalent parts of the different figures bear the same numerical references so as to make it easier to go from one figure to the next.

The different parts represented in the figures are not necessarily according to a uniform scale in order to make the figures more legible.

DETAILED DESCRIPTION OF PARTICULAR EMBODIMENTS

An example of method, according to the invention, for producing a device with transistors will now be given in conjunction with FIGS. 2A-2Q.

The starting material for this method may be a bulk substrate or of semiconductor on insulator type provided with a semiconductor support layer (not represented) coated with an insulating layer (not represented) which may be based on silicon oxide. The substrate also consists of a superficial semiconductor layer 3 situated on and in contact with the insulating layer. The substrate is for example of SOI (silicon on insulator) type with a superficial semiconductor layer 3 made of silicon.

The semiconductor layer 3 comprises two main faces essentially parallel with each other, and called front face and rear face.

The method described here aims to produce two transistors of different types with a first transistor Ta of a first type (for example of P type) and a second transistor Tb of a second type (for example of N type).

A first gate block 6a for the first transistor Ta and a second gate block 6b for the second transistor Tb are firstly formed.

This may be done by etching at least one layer of gate material while protecting the zones of this layer respectively by hard masks 8a, 8b, for example made of silicon nitride (SiN). In this exemplary embodiment, the gates 6a, 6b of the first transistor $T_a$ and the second transistor $T_b$ are sacrificial, that is to say intended to be removed later. The gates 6a, 6b are preferably made of a same material, for example polysilicon.

Figure 2A:
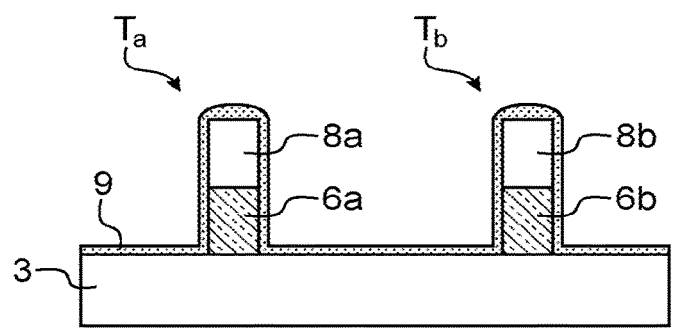
FIGS. 2A-2Q serve to illustrate a first example of method for producing a device with transistors wherein the positioning with respect to the gate of a semiconductor block intended to receive a source and drain region is improved.

Reference will now be made to FIG. 2A which illustrates the formation of a so-called "protective" layer 9 from which the protective blocks are intended to be formed. This protective layer 9 may be produced by conforming deposition of a material, in particular a dielectric such as for example silicon nitride (SiN).

Figure 2B:
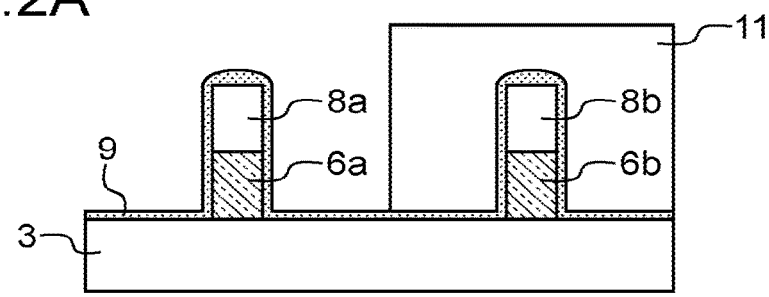

Then (FIG. 2B), a mask 11 is produced on one of the transistors, for example on the second transistor Tb. This mask 11 is typically made of a polymer, for example photosensitive resin, and covers the gate 6b of the second transistor Tb.

Figure 2C:
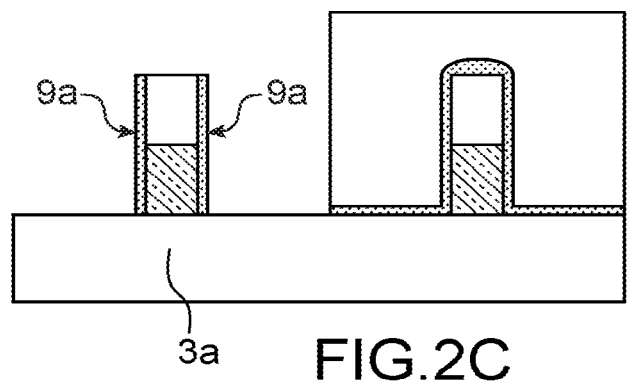

Next (FIG. 2C), by etching the protective layer 9, the protective blocks 9a are formed on the lateral flanks of the first gate block 6a.

Next a step of removal is carried out of portions of the superficial semiconductor layer 3 situated on either side of a region 3a of this superficial semiconductor layer 3 which is arranged facing the gate 6a and is provided to form a channel region of the first transistor Ta.

Figure 2D:
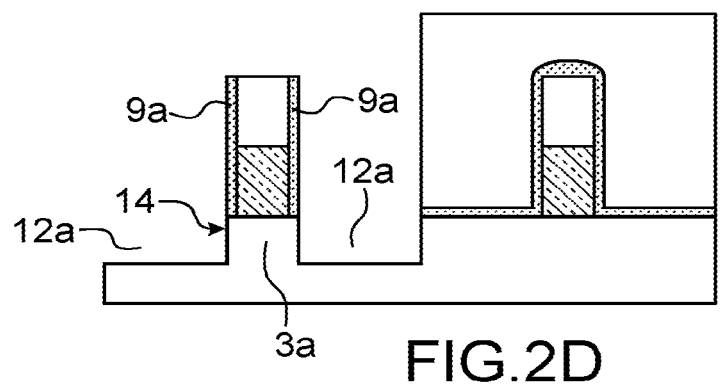

This removal may be carried out by means of anisotropic etching, for example by plasma using a fluorocarbon type or chlorine based chemistry and makes it possible to form cavities 12a arranged on either side of the semiconductor region 3a (FIG. 2D).

The cavities 12a are made of a bottom and lateral walls 14. Among the lateral walls 14, a lateral wall 14 is also contiguous with the region 3a situated facing the gate. This lateral wall 14 contiguous with said region 3a is, furthermore, essentially perpendicular to one of the main faces of the semiconductor layer 3, in particular the front face. Essentially perpendicular is taken to mean that a deviation of more or less 10° of angle, advantageously more or less 5° of angle, with respect to a direction perpendicular to the front face of the semiconductor layer, may be accepted.

Advantageously, all the lateral walls 14 of a cavity 12a may be essentially perpendicular to one of the main faces of the semiconductor layer 3, in particular the front face.

Still advantageously, the cavity 12a also comprises a bottom delimited by the lateral walls 14 and essentially parallel to the front face of the semiconductor layer 3. In other words, the section of the cavity 12a along a sectional plane perpendicular to the front face of the semiconductor layer is a rectangle.

As will be seen in the remainder of the description, and in relation with all the embodiments of the present invention, the orientation of the wall 14 contiguous with the region 3a situated facing the gate enables better control of the encroachment of the source region (or the drain region) facing the gate of the transistor.

This better control of encroachment also makes it possible to reduce the resistance between the source region and the channel region.

When the substrate is of semiconductor on insulator type, the etched thickness of the superficial semiconductor layer 3 to form the cavities 12a is less than the total thickness of the superficial semiconductor layer 3. Under the cavities 12a, a portion of the superficial semiconductor layer 3 is thus conserved.

The mask 11 may next be removed by a stripping method.

Figure 2E:
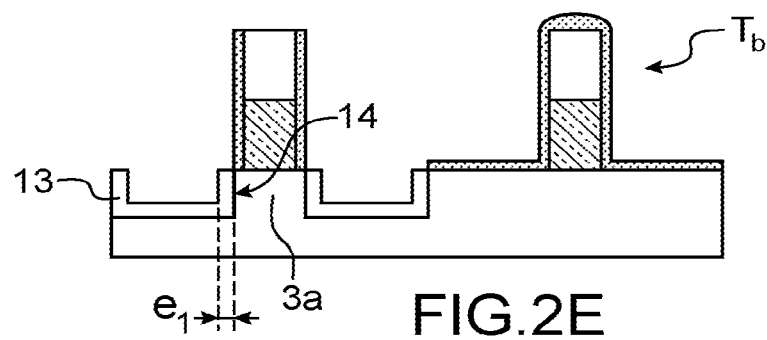

Then, a layer made of a first semiconductor material 13 is made to grow by epitaxy in the cavities 12a (FIG. 2E).

During this epitaxy, the second transistor Tb is protected by the protective layer 9. In this way, the first semiconductor material 13 does not grow facing the second transistor Tb. The epitaxial growth is carried out such that a zone of predetermined thickness $e_1$ of the layer of first semiconductor material 13 lines the bottom and the lateral walls 14 of the cavities 12a. A wall 14 contiguous with the region 3a situated facing the gate is thus coated with a controlled thickness $e_1$ of the first semiconductor material. A semiconductor region which could form a channel access region of the first transistor Ta is thus defined in a precise manner.

The first semiconductor material 13 is advantageously the same material as that of the superficial layer 3 in which the channel region 3a is provided. For example, when the superficial layer 3 is made of silicon, a growth of silicon is carried out in the cavities 12a. The first semiconductor material 13 may be non-doped or lightly doped. "Lightly doped" is taken to mean that it consists of a concentration of dopants less than $1 \times 10^{19}$ at/cm$^3$.

Figure 2F:
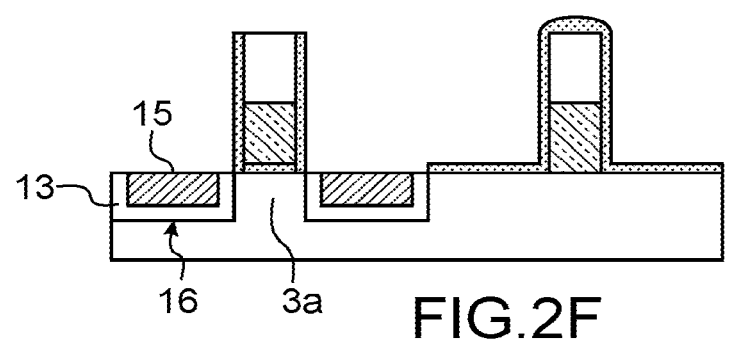

Next, an epitaxial growth of a second semiconductor material 15 is carried out on the first semiconductor material 13 (FIG. 2F).

The growth is carried out so as to fill the cavities 12a and thus replace the portions removed during the step described previously in conjunction with FIG. 2C. The second semiconductor material 15 is different to the first semiconductor material 13 and is advantageously doped. An in situ doping of the second semiconductor material 15 may be carried out during the epitaxial growth. In this way, the extent of the doped semiconductor regions of the transistor is defined more precisely than if doping was carried out by implantation.

According to a particular embodiment of this epitaxial growth, by modifying the gaseous flows containing the doping species during growth, a gradual doping is implemented. A second semiconductor material 15 with a gradient in concentration of dopants is thus obtained. It is thus possible to increase the concentration of dopants during growth so as to obtain a doped region of semiconductor material 15 of which the concentration increases as one moves away from the semiconductor region 3a situated facing the gate.

In an alternative or in combination, the second semiconductor material 15 may also be provided with a lattice parameter different to that of the semiconductor region 3a and preferably different to that of the first semiconductor material. This makes it possible to exert a stress in the semiconductor region 3a in which the channel of the first transistor Ta is intended to be formed. For example, when the semiconductor region 3 is made of silicon, the second semiconductor material 15 may be provided based on $Si_xGe_{1-x}$.

According to a particular embodiment, a second semiconductor material 15 based on $Si_xGe_{1-x}$ is made to grow with a gradient in concentration of dopants, and in particular of which the concentration of germanium decreases during deposition in such a way as to obtain a doped region of semiconductor material 15 of which the concentration of germanium increases as one moves closer to the semiconductor region 3a situated facing the gate.

The successive epitaxies of semiconductor materials 13 and 15 make it possible to form semiconductor blocks 16 in which source and drain regions of the first transistor Ta are capable of being formed. When the first transistor Ta is of PMOS type with a semiconductor region 3a made of silicon, the second semiconductor material 15 is for example SiGe doped with boron (SiGe:B) in order to form semiconductor blocks 16 doped and configured to place the channel under tensile stress.

Figure 2G:
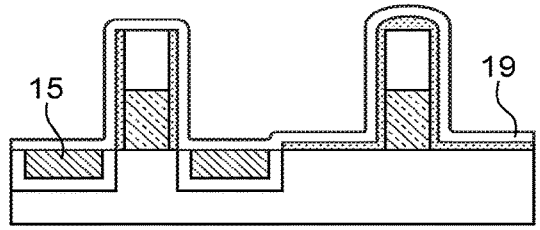

Next, another protective layer 19 is produced in which second protective blocks are intended to be formed (FIG. 2G). This protective layer 19 may be produced by conforming deposition of a dielectric material, such as for example silicon nitride (SiN).

Figure 2H:
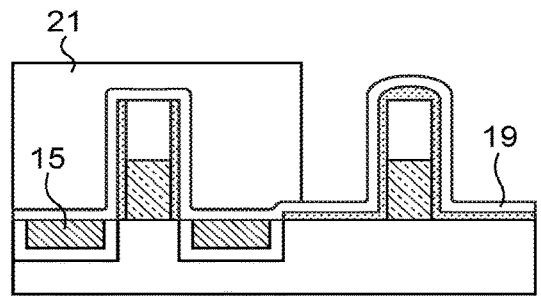

Then (FIG. 2H), a mask 21 is produced facing the first transistor Ta. This mask 21 is typically made of photosensitive resin.

Next, first protective blocks 9b and second protective blocks 19b are formed on the lateral flanks of the second gate 8a by etching of the layers 9 and 19, the first blocks 9b being arranged against the second sacrificial gate 6b, whereas the second blocks 19b are arranged against the first protective blocks 9b. The stack of protective blocks 9b, 19b forms spacers. In this exemplary embodiment, these spacers may be removed later and will be qualified as "sacrificial".

Figure 2I:
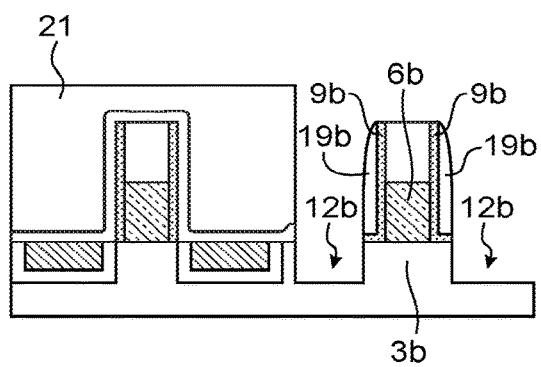

Next, a step of removal of portions of the superficial semiconductor layer 3 is carried out. The removed portions are situated on either side of a region 3b of the superficial semiconductor layer arranged facing the second gate 6b and which is provided to form a channel region of the second transistor Tb. This removal makes it possible to form cavities 12b arranged on either side of the region 3b in which a channel of the second transistor Tb is provided (FIG. 2I).

The mask 21 may next be removed.

Figure 2J:
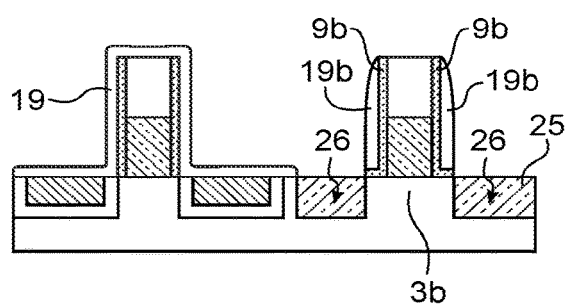

Then, at least one semiconductor material 25 is next made to grow by epitaxy in the cavities 12b. During this epitaxy, the first transistor Ta is protected by the protective layer 19 (FIG. 2J).

The semiconductor material 25 is different to that of the region 3b and may be doped and/or provided with a lattice parameter different to that of the semiconductor region 3b.

When the second transistor Tb is of NMOS type with a semiconductor region 3b made of silicon, the semiconductor material 25 is for example SiC doped with phosphorous noted SiC:P in order to form semiconductor blocks 26 configured to place the channel of the second transistor Tb under tensile stress.

Figure 2K:
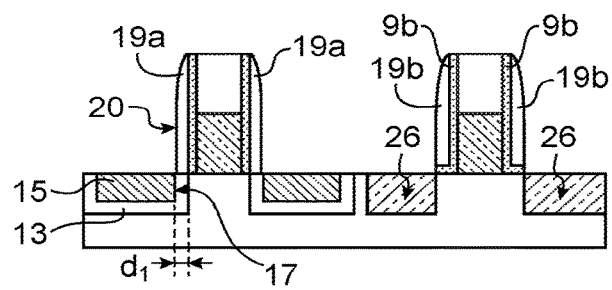

Next, second protective blocks 19a are formed on either side of the first gate 8a by etching of the protective layer 19, the second protective blocks 19a being arranged against the first protective blocks 9a produced previously (FIG. 2K). The stack of blocks 9b, 19b on the first gate 6a forms sacrificial spacers. The thickness d of the protective layer 19 and the etching of this protective layer 19 may be carried out so as to arrange the second protective blocks 19a as a function of the positioning of an interface 17 between the first semiconductor material 13 and the second semiconductor material 15.

In the particular exemplary embodiment of FIG. 2K, it is provided to form the second protective blocks 19a such that their outer face 20 is aligned or situated in the extension of the interface 17 between the first semiconductor material 13 and the second semiconductor material 15. To enable this alignment, it is possible to provide a thickness d of the protective layer equal to the thickness $e_1$ of the first semiconductor material 13. In this case, this makes it possible to create channel access regions of the first transistor Ta without encroachment or overlap. More specifically, when the first semiconductor material 13 is not doped, this makes it possible not to have doping under the spacers.

Figure 2L:
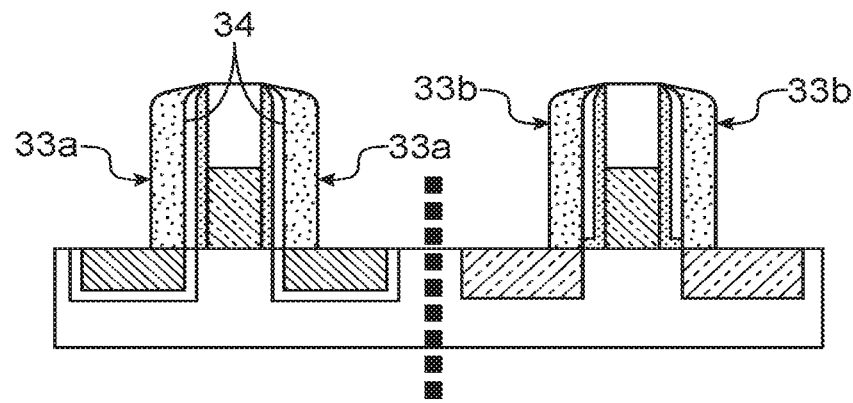

Next, insulating spacers 33a, 33b are produced on either side respectively of the first gate 6a and the second gate 6b (FIG. 2L). The insulating spacers 33a, 33b are provided preferably based on a material able to withstand selective etching vis-à-vis the material(s) of the protective blocks 9a, 9b, 19a, 19b.

The material of the insulating spacers 33a, 33b may be for example based on $SiO_2$. Insulating spacers 33a, 33b made of oxide having a low dielectric constant, for example of the order of 3 or 4, may be produced in order to limit parasitic capacitances.

According to another exemplary embodiment, insulating spacers 33a, 33b are formed, for example made of SiCBN and SiCO. The insulating spacers 33a, 33b are laid out such that their inner face 34 is situated in the extension and aligned with an interface 17 between the first semiconductor material 13 and the second semiconductor material 15 (FIG. 2L).

Next, an insulating layer 35 is formed by conforming deposition on the first transistor Ta and the second transistor Tb. The insulating layer 35 may be a CESL (Contact Etch Stop Layer) typically based on silicon nitride.

Figure 2M:
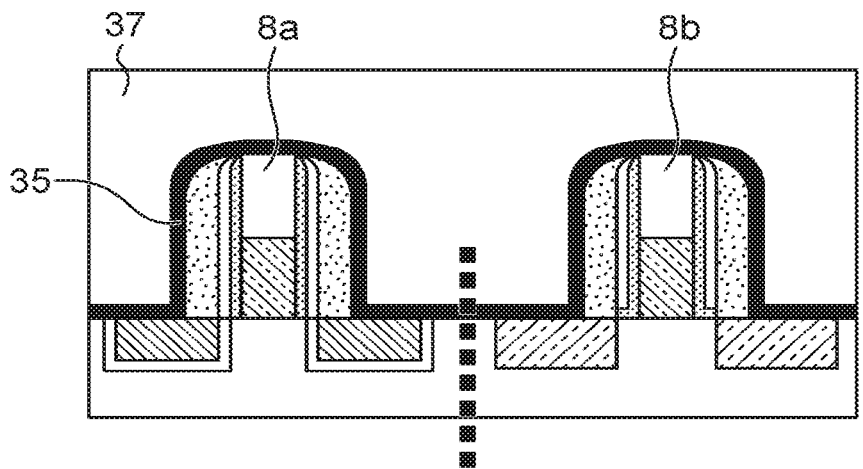

Then (FIG. 2M), another insulating layer 37 is deposited in such a way as to cover the transistors Ta and Tb. This other insulating layer may be of PMD (Pre Metal Dielectric) type and for example be made of silicon oxide.

The stack of insulating layers 35, 37 forms a masking. A partial removal of portions of the insulating layers 35, 37 and the hard masks 8a, 8b is next carried out so as to expose respectively the first gate 6a and the second gate 6b. This removal is advantageously conducted by CMP.

Figure 2N:
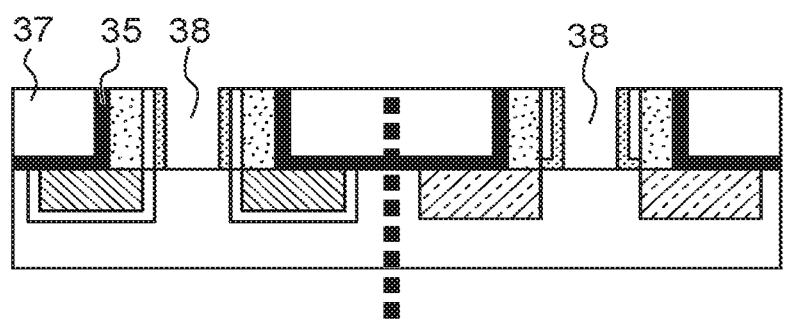

The sacrificial gates 6a, 6b are next removed. When the sacrificial gates are made of polysilicon, this removal may be carried out for example by chemical etching using TMAH (FIG. 2N). Openings 38 are thus formed in the masking 35-37.

Next, the sacrificial spacers formed of the protective blocks 9a, 9b, 19a, 19b are removed by selective etching vis-à-vis the insulating spacers 33a, 33b. When the protective blocks 9a, 9b, 19a, 19b are made of silicon nitride and the insulating spacers 33a, 33b are made of silicon oxide, an etching using $H_3PO_4$ may be carried out for example.

Figure 2O:
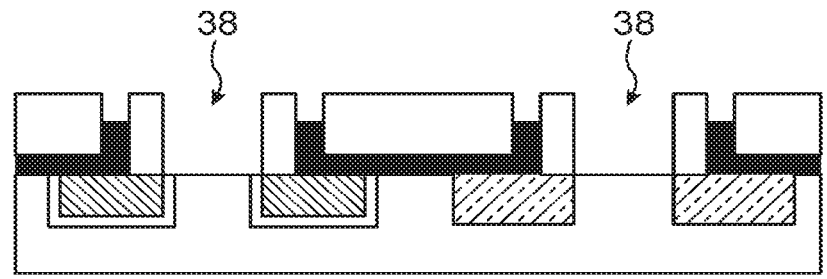

According to another exemplary embodiment with protective blocks 9a, 9b, 19a, 19b made of silicon nitride and insulating spacers 33a, 33b made of SiCBN and SiCO, the selective etching is carried out using hydrofluoric acid (FIG. 2O). The removal of the sacrificial spacers leads to a widening of the openings 38 formed in the masking 35-37.

Figure 2P:
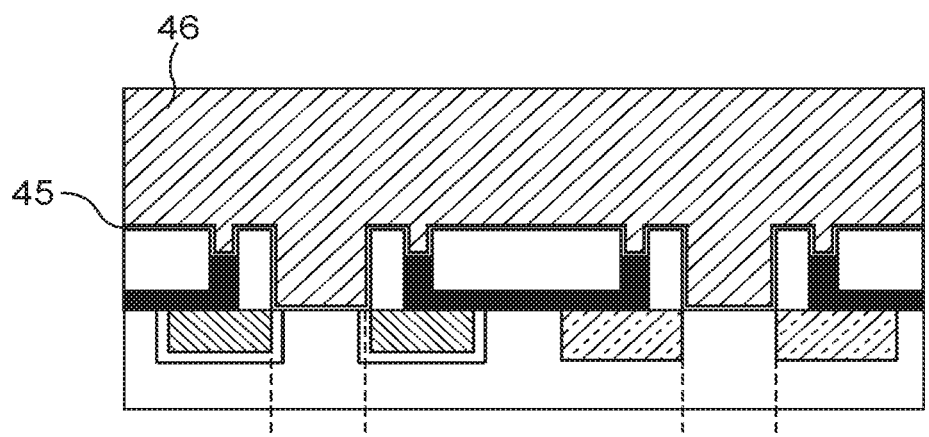
Figure 2Q:
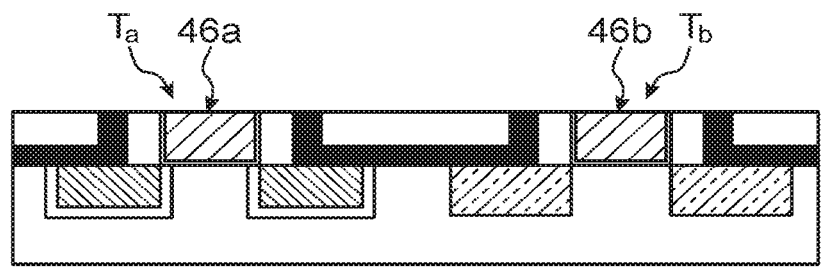

Then, in the openings 38, a gate dielectric 45 is next deposited, for example of high-k type such as $HfO_2$, then at least one gate material 46, formed for example of a metal coating based on TiN and a metal filling material such as W. The gate stack thus fills a region situated between the insulating spacers 33a, 33b of the first transistor Ta and the second transistor Tb (FIG. 2P).

Next, a removal of a portion of this gate stack is carried out in particular in a zone situated above the insulating spacers 33a, 33b. This removal is advantageously carried out by CMP. Gates 46a, 46b are thus formed respectively for the first transistor Ta and for the second transistor Tb (FIG. 2Q).

In the exemplary embodiment that has just been given, the semiconductor blocks 16 formed by a succession of epitaxies are intended to form source and drain regions of a P type transistor. It is also possible to apply such a type of method to the production of an N type transistor.

Similarly, the exemplary embodiment described previously provides to produce the source and drain regions of the P type transistor before those of the N type transistor. According to an alternative embodiment, it is also possible to form the semiconductor blocks 26 on either side of the second transistor Tb, before producing the semiconductor blocks 16 of the first transistor Ta.

In an alternative of one or the other of the exemplary embodiments that have been given, other compositions may be provided for the insulating spacers 33a, 33b and the protective blocks 9a, 9b, 19a, 19b. It is possible in particular to produce the protective blocks 9a, 9b, 19a, 19b and the insulating spacers 33a, 33b based on a same dielectric material, such as for example silicon nitride. In this case, a removal of the protective blocks is carried out by etching over time. The positioning of the insulating spacers 33a, 33b with respect to the regions of epitaxied semiconductor material 13 and 15 nevertheless risks being less precise than in the example of method described previously.

According to another alternative embodiment, raised source and drain semiconductor regions are provided for the first transistor Ta and/or the second transistor Tb. Raised semiconductor regions are taken to mean regions that extend beyond the upper face of the layer on which rest the respective gates of the transistors.

An exemplary embodiment of such an alternative firstly comprises the implementation of steps such as those described previously in conjunction with FIGS. 2A-2K.

Next, the transistors Ta, Tb are coated with an insulating layer 59 for example based on silicon nitride (SiN).

Then, a mask 61 is produced, for example made of photosensitive resin on one of the transistors, for example on the second transistor $T_b$.

Figure 3A:
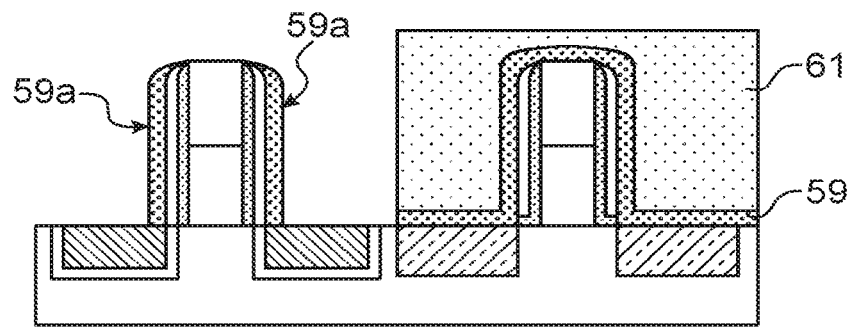
FIGS. 3A-3E serve to illustrate an alternative embodiment aiming to form raised source and drain regions.

Next, by etching of the insulating layer 59, insulating blocks 59a are formed on the lateral flanks of the gate block 6a of the first transistor Ta, whereas the insulating layer 59 is preserved on the second transistor Tb (FIG. 3A).

Next, the mask 61 may be removed.

Figure 3B:
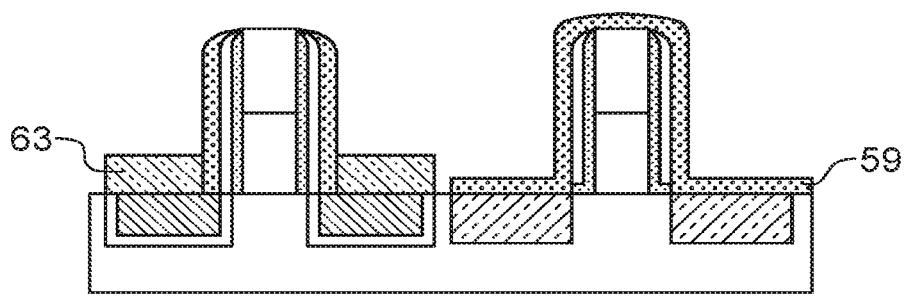

Then, in order to produce the raised semiconductor regions a semiconductor material 63 is made to grow by epitaxy on either side of the gate 6a of the first transistor Ta. During this step, the second transistor Tb is protected by the insulating layer 59 (FIG. 3B). The semiconductor material 63 may be similar to the second semiconductor material 15, for example SiGe doped with boron.

Figure 3C:
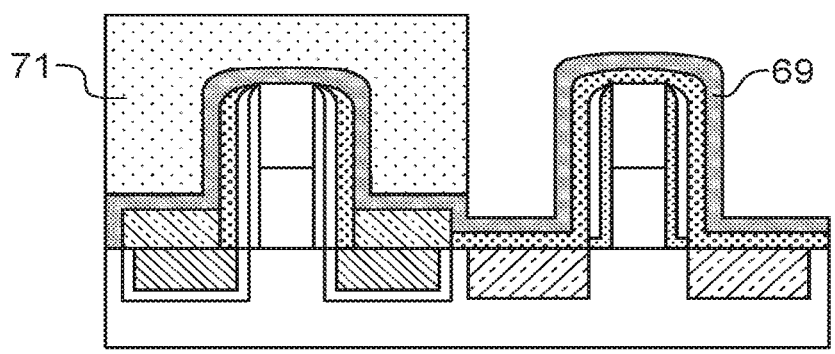

Another insulating layer 69 is next formed, for example by conforming deposition of a dielectric material such as for example silicon nitride (SiN). Then (FIG. 3C), a mask 71 is produced, for example made of photosensitive resin facing the first transistor Ta.

Next, insulating blocks 79b are formed on the lateral flanks of the second gate 6b by etching of the layers 59 and 69.

Next, the masking 71 facing the first transistor Ta may be removed.

Figure 3D:
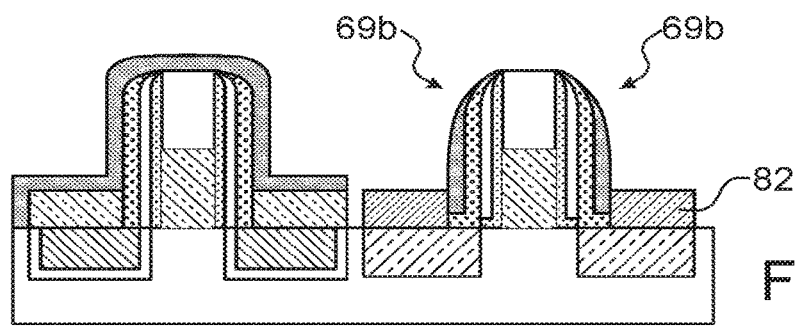

Then, in order to produce raised semiconductor regions for the second transistor Tb, semiconductor material 82 is made to grow by epitaxy on either side of the gate 6a of the first transistor Ta, the second transistor Tb being protected by the insulating layer 59 (FIG. 3D).

The semiconductor material 82 may be similar to the semiconductor material 25, for example SiC.

Figure 3E:
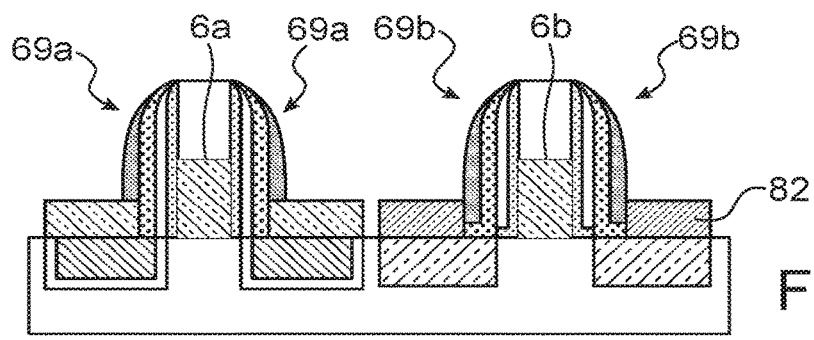

Next, second insulating blocks 69a are formed on either side of the first gate 8a by etching of the layer 69, the second insulating blocks 69a being arranged against the first insulating blocks 59a produced previously (FIG. 3E).

The steps of the method may next be carried out such as described previously in conjunction with FIGS. 2M-2Q aiming to replace gates 6a, 6b of the transistors Ta, Tb by other gates, by implementing a method during which a masking is formed with openings exposing the gates 6a, 6b, then a removal of the gates 6a, 6b so as to empty the openings of the masking. Then, in these openings, a gate stack is produced in order to form replacement gates.

In certain cases, it may be wished to have a encroachment of a doped semiconductor zone and/or stressor material under the gate of the transistor.

Figure 4A:
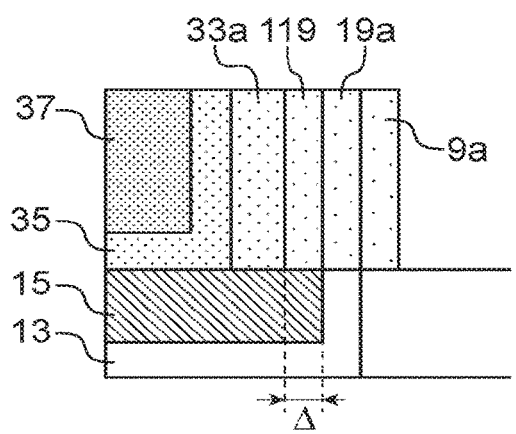
FIGS. 4A-4C serve to illustrate an alternative embodiment in which a controlled overlap is created between a semiconductor block formed by epitaxy and a transistor gate.
Figure 4B:
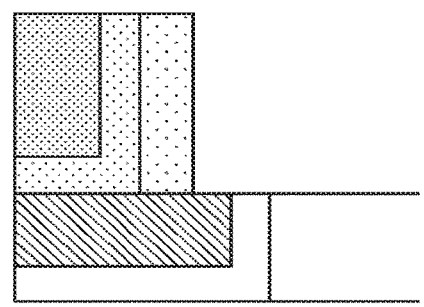
Figure 4C:
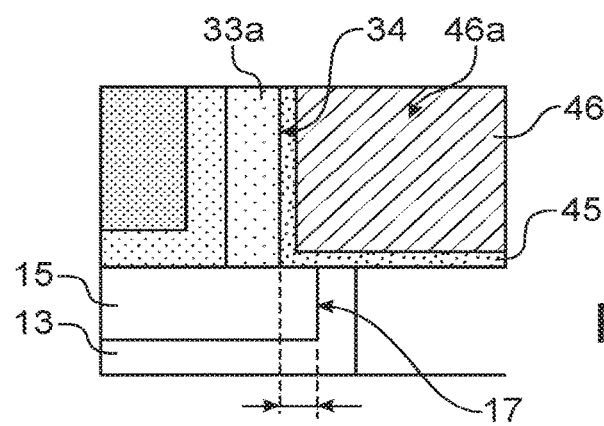

An alternative embodiment of the example of method described previously and in which such a encroachment is implemented is illustrated in FIGS. 4A-4C.

For this alternative, after the step described in conjunction with FIG. 2K during which sacrificial spacers 9a-19a, 9b-19b are produced on either side of the gates 6a, 6b of the transistors Ta, Tb, additional protective blocks 119 are formed against these sacrificial spacers. The additional protective blocks are produced preferably made of a same material as the protective blocks 9a, 9b, 19a, 19b forming the sacrificial spacers, for example silicon nitride. The encroachment that it is wished to obtain thereafter depends on the thickness A that is chosen for this layer.

Next the steps as described previously in conjunction with FIGS. 2L, 2M are carried out, during which the insulating spacers 33a, 33b are formed, then a masking by deposition and planarization of the insulating layers 35 and 37.

In FIG. 4A, the device during production is represented once the first sacrificial gate 6a and the second sacrificial gate 6b have been removed.

Next, a removal of the sacrificial spacers formed of the protective blocks 9a, 9b, 19a, 19b, as well as the additional protective blocks 119 (FIG. 4B) is carried out. The removal is advantageously carried out by selective etching vis-à-vis the insulating spacers 33a, 33b. An etching using $H_3PO_4$ is carried out when the protective blocks 9a, 9b, 19a, 19b, 119 are made of silicon nitride and when the insulating spacers 33a, 33b are made of silicon oxide.

Then, the sacrificial gates are replaced by a dielectric stack of dielectric 45 and gate material 46 that is formed between the insulating spacers 33a 33b in order to form a replacement gate 46a (FIG. 4C).

A controlled misalignment is thus obtained between, on the one hand, the interface 17 (separation surface between the first semiconductor material 13 and the second semiconductor material 15) and, on the other hand, an outer face 34 of insulating spacers 33a arranged against the gate 46a.

Another alternative embodiment of the example of method described previously in conjunction with FIGS. 2L-2Q will now be given in conjunction with FIGS. 5A-5D. It concerns another way of producing the insulating spacers.

For this alternative, once the source and drain semiconductor blocks 16, 26 of the first Ta and the second transistor Tb have been formed for example by means of a method such as described in conjunction with FIGS. 2A-2K, the masking 35-37 is directly formed on the transistors Ta, Tb. To do so, the insulating layer 35 is deposited by conforming deposition for example of silicon nitride, then the other insulating layer 37 for example silicon oxide, is deposited.

The stack of insulating layers 35, 37 forms a masking.

Next a removal is carried out by CMP of portions of the insulating layers 35, 37 and hard masks 8a, 8b so as to expose respectively the first gate 6a and the second gate 6b. Blocks 35a of the insulating layer are then conserved against the lateral flanks of the sacrificial gates 6a, 6b.

Figure 5A:
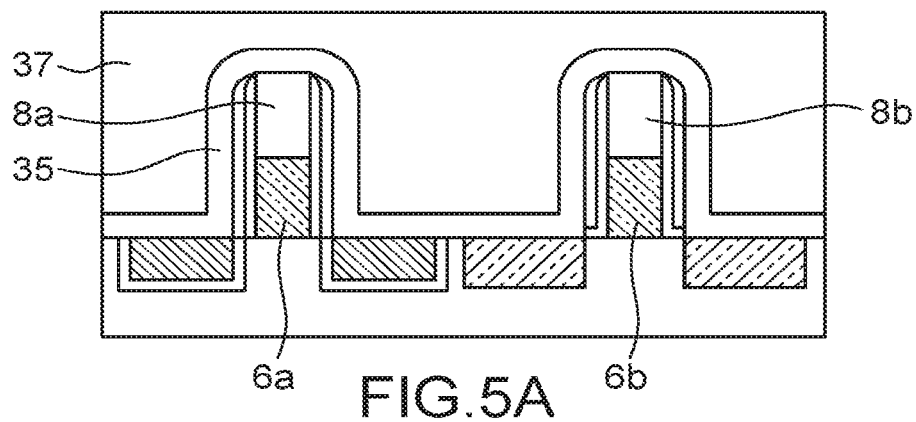
FIGS. 5A-5D serve to illustrate an alternative embodiment in which an insulating layer of a masking serving for the replacement of a sacrificial gate is used to form insulating spacers of a transistor.
Figure 5B:
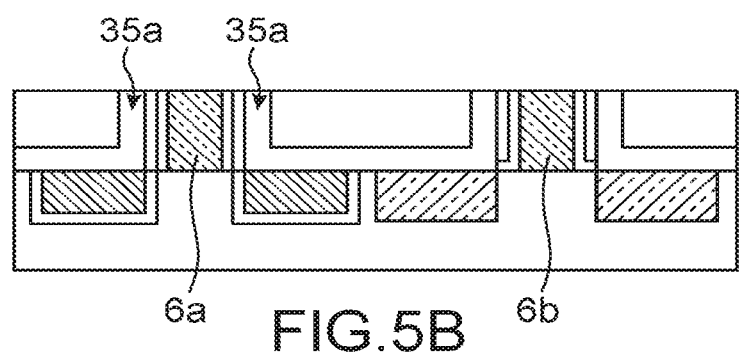

The sacrificial gates 6a, 6b are next removed, openings 38 thus being produced in the masking 35-37 (FIG. 5B).

Figure 5C:
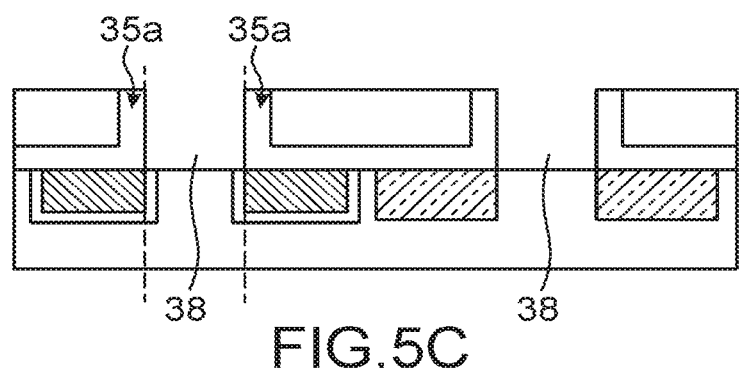

Next, the protective blocks 9a, 9b, 19a, 19b are eliminated by selective etching vis-à-vis the insulating layer 35 of the masking (FIG. 5C).

Figure 5D:
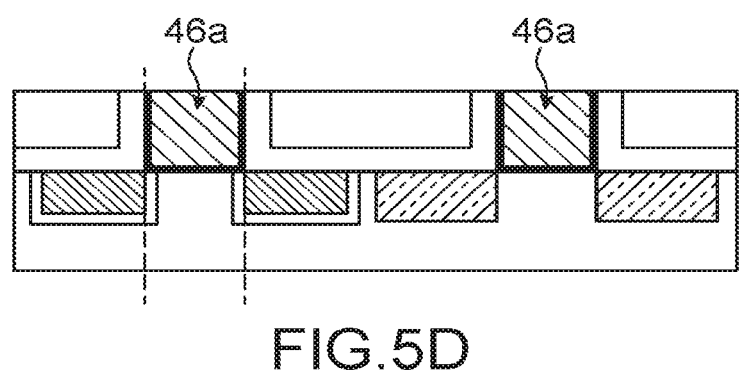

Then, in the openings 38, a stack of gate dielectric and gate material is formed so as to form gates 46a, 46b respectively for the first transistor Ta and the second transistor Tb (FIG. 5D).

Another example of method is given in FIGS. 6A-6F.

The transistor produced here has asymmetric source and drain regions and may be for example a TFET (Tunnel Field Effect Transistor) of which the source and drain regions are doped according to opposite dopings, respectively N and P or P and N.

The starting substrate for this method may be similar to that used in one or the other of the examples described previously.

Figure 6A:
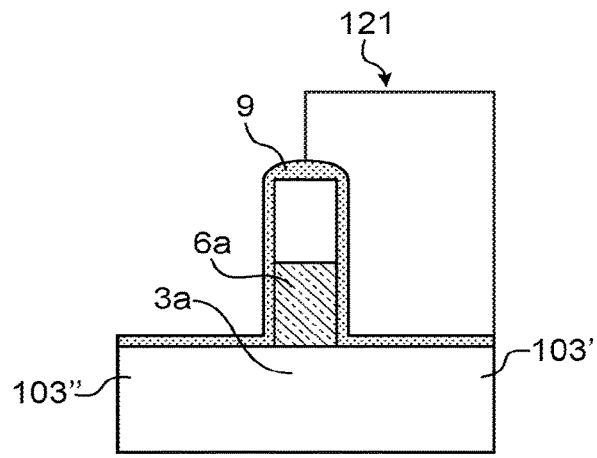
FIGS. 6A-6F serve to illustrate a method for producing a transistor, in particular of TFET type, of which the source and drain regions have a dissymmetry with respect to the channel.
Figure 6D:
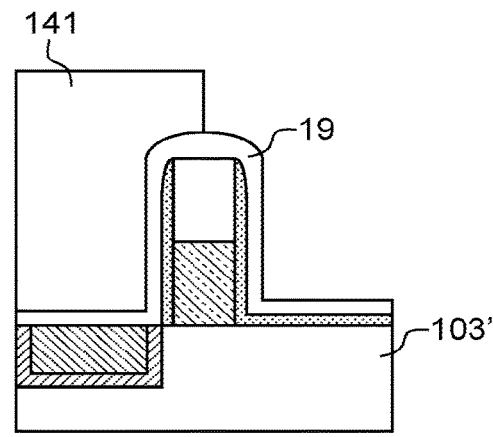

After having formed a gate 6a (for example made of polysilicon) for a transistor Ta and having covered it with a protective layer 9 (for example made of silicon nitride), a mask 121 is formed partially covering the transistor $T_a$ (FIG. 6A).

The mask 121 (for example made of photosensitive resin) is arranged facing a first portion 103' of the semiconductor layer 3 adjoining a region 3a in which the channel of the transistor Ta is provided. The mask 121 does not extend facing a second portion 103" of the semiconductor layer 3 also contiguous with the channel region 3a of the transistor Ta. The first portion 103' and the second portion 103" are arranged on either side of the channel region 3a.

Next, the protective layer 9 is etched, in such a way as to remove this layer 9 facing the second portion 103" and to conserve a first protective block 9a against a lateral flank of the gate 6a.

Then, a removal of the mask 121 is carried out.

Figure 6B:
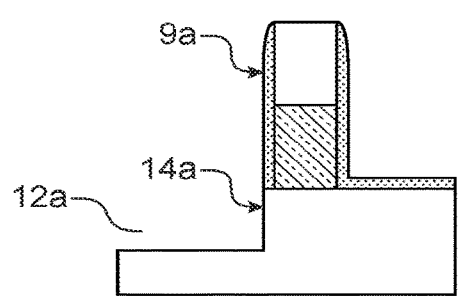

Next, a first cavity 12a is produced in the second portion 103" of the semiconductor layer 3 thus exposed (FIG. 6B). This first cavity 12a is provided with a vertical wall 14 contiguous with the region 3a and which is arranged in the extension of an outer face of the first protective block 9a formed against a first lateral flank of the gate 6a.

Next, an epitaxial growth of a first semiconductor material 113 is carried out in the cavity 12a. The first semiconductor material 113 may be identical to that of the semiconductor region 3a arranged facing the gate 6a, for example made of silicon.

Preferably, the first semiconductor material 113 is non-doped or lightly doped. The thickness $e_1$ formed of first semiconductor material 113 is precisely controlled during this epitaxy step.

Figure 6E:
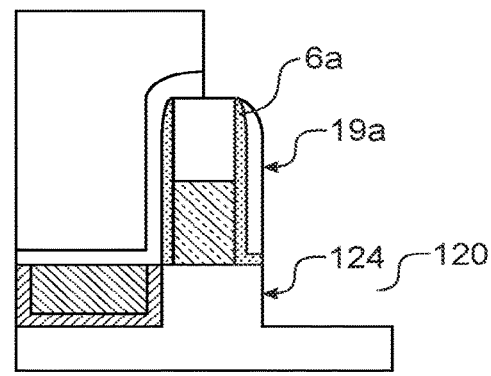
Figure 6C:
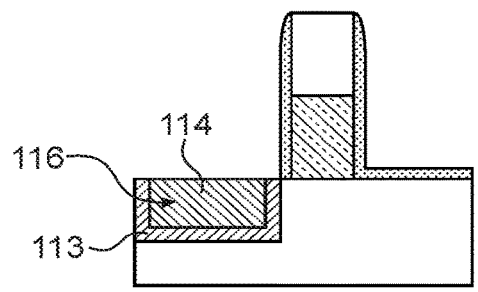

Next, an epitaxial growth of a second semiconductor material 115 is carried out on the first semiconductor material 113 (FIG. 6C).

The second material 115 is provided with a doping different to that of the first semiconductor material 113 and/or a lattice parameter different to that of the first semiconductor material 113. The second semiconductor material 115 may be N-doped and for example be made of SiC doped with phosphorous, in particular when the superficial layer 3 in which the channel is provided is made of silicon.

An N-doped semiconductor block 116 is thus produced, in which a source or drain region of the transistor is capable of being formed and of which the positioning with respect to the gate is controlled.

Next another protective layer 19 is formed in which second protective blocks are intended to be formed. This protective layer 19 (for example made of silicon nitride) is produced by deposition so as to cover the semiconductor block 16, the gate 6a and the first portion 103' of the semiconductor layer 3.

Then (FIG. 6D), another mask 141 is produced partially covering the first transistor Ta. This mask 141 is for example made of photosensitive resin and is arranged on a portion of the gate 6a and the semiconductor block 16. The mask 141 is laid out such that it does not extend facing the first portion 103' of the semiconductor layer 3 and another portion of the gate 6a.

Next, a step of removal of a portion of the layers 9, 19 is carried out so as to produce a spacer formed of a stack of protective blocks 9a, 19 against a second lateral flank of the gate 6a, opposite to the first flank.

Then, a removal of the masking 141 is carried out.

A second cavity 120 is next produced by etching in the first portion 103" of the semiconductor layer 3 thus exposed, whereas the semiconductor block 116 is protected by the protective layer 19 (FIG. 6E). This second cavity 12a is provided with a vertical wall 124 adjoining the region 3a and which is aligned with a spacer formed of a stack of protective blocks 9a, 19a, etched respectively in the protective layers 9 and 19.

Figure 6F:
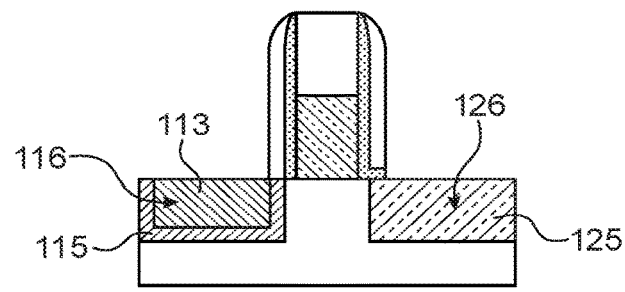

This second cavity 120 is next filled with a semiconductor material 125 that is formed by epitaxial growth. The material 125 is provided with a doping opposite to that of the second semiconductor material 115. The material 125 may be P doped and for example made of SiGe doped with boron (FIG. 6F). The cavity 120 filled with semiconductor material 125 forms a semiconductor block 126 in which a drain or source region of the transistor is capable of being produced.

It is thus possible to form an N type junction on one side of the gate 6a and a P type junction on the other side.

According to a particular embodiment, it may be chosen to make the channel access regions non-symmetrical, for example by providing to form a first semiconductor material 113 doped during the epitaxy or instead with a lattice parameter different to that of the semiconductor channel region 3a.

One or the other of the methods that have been described apply for example to the production of FDSOI (Fully Depleted Silicon On Insulator) type transistors, a technology implemented on a semiconductor on insulator type substrate in which the insulating layer of the substrate has a composition and a thickness provided to enable electrostatic coupling between the support layer and a channel region of the transistors formed in the superficial layer.

One or the other of the methods that have been described also apply to other types of substrates and in which the superficial semiconductor layer receiving the channel region of the transistors is made of semiconductor material other than silicon, for example Ge, or SiGe, or a III-V material.

The invention claimed is:

1. A method for producing a microelectronic device with one or more transistors, the method comprising:
   a) forming at least one first gate on a given region of a semiconductor layer wherein a channel of a first transistor is arranged, wherein the at least first gate is a sacrificial gate,
   b) forming at least one first cavity in the semiconductor layer, wherein the at least one first cavity has a wall contiguous with the given region, wherein the wall is essentially perpendicular to a main face of the semiconductor layer,
   wherein the forming of the at least one first cavity comprises:
      depositing a first protective layer on the at least one first gate, and
      etching the first protective layer so as to form first protective blocks on either side of the at least one first gate,
      wherein a thickness of the first protective layer and the etching of the first protective layer is provided such that an outer face of the first protective blocks is aligned with the wall,
   c) filling the at least one first cavity in such a way as to form a first semiconductor block wherein a source or drain region of the first transistor is provided,
   wherein the formation of the first semiconductor block comprises:
      epitaxial growth of a first semiconductor material in the at least one first cavity, wherein the growth is carried out such that a first zone of a predetermined thickness of a layer of the first semiconductor material lines the wall contiguous with the given region, and
      epitaxial growth of a second zone made of a second semiconductor material on the first zone, wherein the second semiconductor material has a doping different from that of the first semiconductor material and/or has a lattice parameter different from that of the first semiconductor material,
   the method further comprising, after c):
      depositing a second protective layer on the first transistor and on the first protective blocks,
      etching the second protective layer so as to form second protective blocks on either side of a structure formed of the at least one first gate and the first protective blocks,
      wherein a thickness of the second protective layer and the etching of the second protective layer is provided such that an outer face of the second protective blocks is aligned or substantially aligned with an interface between the first zone of the first semiconductor material and the second zone of the second semiconductor material,
   then after forming of the second protective blocks:
      forming insulating spacers on either side of the second protective blocks,
      removing the at least one first gate and the first and second protective blocks, and
      forming a replacement gate between the insulating spacers.

2. The method according to claim 1, wherein the removal of the at least one first gate comprises:
   forming a masking covering the first transistor,
   carrying out a planarization of the masking so as to expose the at least one first gate, and
   etching the at least one first gate so as to form an opening in the masking.

3. The method according to claim 2, wherein the removal of the at least one first gate leads to forming the opening in the masking, and wherein the removal of the first and second protective blocks leads to a widening of the opening,
   wherein the formation of the replacement gate comprises:
      deposition of a gate stack in the widened opening, and then
      planarization of the gate stack.

4. The method according to claim 1, wherein the first semiconductor material of the first zone is non-doped or has a lower doping than that of the second semiconductor material.

5. The method according to claim 1, wherein the first zone and the given region wherein a transistor channel is capable of being formed are based on a same semiconductor material.

6. The method according to claim 1, wherein the second semiconductor zone is formed by epitaxial growth of the second semiconductor material such that the second semiconductor material consists of a gradient in concentration of dopants and/or concentration of germanium.

7. The method according to claim 1, wherein the first transistor is a transistor of a first type, wherein a second gate of a second transistor of a second type is formed in a) on the semiconductor layer, and, wherein during the production of the at least one first cavity, the second transistor is protected by a first mask, the method further comprising, after c):
   removing the first mask,
   forming a second mask on the first transistor,
   forming other cavities in the semiconductor layer, around another region of the semiconductor layer on which the second gate rests, and wherein a channel of the second transistor is capable of being produced, and
   forming semiconductor blocks in the other cavities and wherein source and drain regions of the second transistor are capable of being produced.

* * * * *